US007700257B2

(12) United States Patent
Ogata et al.

(10) Patent No.: US 7,700,257 B2
(45) Date of Patent: Apr. 20, 2010

(54) PHOTORESIST COMPOSITION AND RESIST PATTERN FORMATION METHOD BY THE USE THEREOF

(75) Inventors: Toshiyuki Ogata, Kawasaki (JP); Kotaro Endo, Kawasaki (JP); Hiromitsu Tsuji, Kawasaki (JP); Masaaki Yoshida, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 943 days.

(21) Appl. No.: 10/547,427

(22) PCT Filed: Mar. 24, 2004

(86) PCT No.: PCT/JP2004/004012

§ 371 (c)(1), (2), (4) Date: Aug. 29, 2005

(87) PCT Pub. No.: WO2004/088428

PCT Pub. Date: Oct. 14, 2004

(65) Prior Publication Data

US 2006/0166130 A1 Jul. 27, 2006

(30) Foreign Application Priority Data

Mar. 28, 2003 (JP) ............................. 2003-092764
Mar. 28, 2003 (JP) ............................. 2003-092765
Jun. 24, 2003 (JP) ............................. 2003-180258
Jun. 24, 2003 (JP) ............................. 2003-180259

(51) Int. Cl.
G03F 7/004 (2006.01)
G03F 7/30 (2006.01)

(52) U.S. Cl. .................... 430/270.1; 430/326; 430/330; 430/907

(58) Field of Classification Search ............. 430/270.1, 430/905, 907, 910, 326, 330
See application file for complete search history.

(56) References Cited

U.S. PATENT DOCUMENTS

| 5,556,734 | A  | * | 9/1996  | Yamachika et al. | ...... 430/270.1 |
| 6,200,724 | B1 | * | 3/2001  | Namiki et al.    | ......... 430/270.1 |
| 6,787,286 | B2 | * | 9/2004  | Szmanda et al.   | ........ 430/270.1 |
| 6,790,587 | B1 | * | 9/2004  | Feiring et al.   | ......... 430/270.1 |
| 6,855,475 | B2 | * | 2/2005  | Szmanda          | ........... 430/270.1 |
| 7,211,366 | B2 | * | 5/2007  | Dammel et al.    | ......... 430/270.1 |
| 2002/0161148 | A1 | * | 10/2002 | Harada et al.    | ............... 526/242 |
| 2002/0177067 | A1 |   | 11/2002 | Kim              | ...................... 430/270.1 |
| 2003/0027076 | A1 | * | 2/2003  | Szmanda          | ............. 430/270.1 |
| 2003/0082479 | A1 |   | 5/2003  | Hatakeyama et al. | ..... 430/270.1 |
| 2003/0194639 | A1 |   | 10/2003 | Miya et al.      | .............. 430/270.1 |
| 2003/0194644 | A1 |   | 10/2003 | Hatakeyama et al. | .... 430/270.1 |
| 2003/0194645 | A1 |   | 10/2003 | Harada et al.    | ........... 430/270.1 |
| 2004/0166434 | A1 | * | 8/2004  | Dammel et al.    | ......... 430/270.1 |

FOREIGN PATENT DOCUMENTS

| JP | 2001-194776 | 7/2001 |
| JP | 2002-090997 | 3/2002 |
| JP | 2002-145962 | 5/2002 |
| JP | 2002-234916 | 8/2002 |
| JP | 2002-525683 | 8/2002 |
| JP | 2002-268226 | 9/2002 |
| JP | 2002-338634 | 11/2002 |
| JP | 2002-363148 | 12/2002 |
| JP | 2002-543469 | 12/2002 |
| JP | 2003-002925 | 1/2003 |
| JP | 2003-043689 | 2/2003 |
| JP | 2003-057825 | 2/2003 |
| JP | 2003-89708 | 3/2003 |
| JP | 2003-292547 | 10/2003 |
| JP | 2003-330196 | 11/2003 |
| JP | 2004-4561 | 1/2004 |
| JP | 2004-4697 | 1/2004 |
| JP | 2004-077908 | 3/2004 |
| JP | 2004-077908 A | 3/2004 |
| JP | 2004-101934 | 4/2004 |
| JP | 2004-101934 A | 4/2004 |

(Continued)

OTHER PUBLICATIONS

Shun-ichi Kodama et al., "Synthesis of Novel Fluoropolymer for 157 nm Photoresists by Cyclo-polymerization" Proceedings of SPIE, vol. 4690, (2002) pp. 76-83.*
Crawford, M. K., "New Materials for 157 nm Photoresists: Characterization and Properties", *Proceedings of SPIE*, vol. 3999, pp. 357 to 364 (2000).
Kodama, S. et al., "Synthesis of Novel Fluoropolymer for 157 nm Photoresists by Cyclo-polymerization" *Proceedings of SPIE*, vol. 4690, pp. 76 to 83 (2002).

*Primary Examiner*—John S Chu
(74) *Attorney, Agent, or Firm*—Wenderoth, Lind & Ponack, L.L.P.

(57) ABSTRACT

A photoresist composition containing a polymer (A) containing an alkali-soluble constituent unit (a1) containing an alicyclic group having both a fluorine atom or a fluorinated alkyl group (i) and an alcoholic hydroxyl group (ii), whose alkali-solubility is changeable by an action of an acid; an acid generator (B) which generates an acid by light irradiation; and a dissolution inhibitor (C) having a fluorine atom(s) and/or a nitrogen-containing compound (D) selected from a tertiary amine (d1) having a polar group, a tertiary alkylamine (d2) having 7 or more and 15 or less of carbon atoms or an ammonium salt (d3). The composition has a resist property capable of accomplishing line and space (1:1) of 90 nm or less in good shape as a pattern processing accuracy of a semiconductor integrated circuit by lithography.

21 Claims, No Drawings

FOREIGN PATENT DOCUMENTS

| | | |
|---|---|---|
| JP | 2004-109834 | 4/2004 |
| JP | 2004-109834 A | 4/2004 |
| JP | 2004-226728 | 8/2004 |
| JP | 2004-226728 A | 8/2004 |
| JP | 2004-233429 | 8/2004 |
| JP | 2004-233429 A | 8/2004 |
| WO | 00/17712 | 3/2000 |
| WO | 00/67072 | 11/2000 |

* cited by examiner

PHOTORESIST COMPOSITION AND RESIST PATTERN FORMATION METHOD BY THE USE THEREOF

TECHNICAL FIELD

The present invention relates to a photoresist composition used for patterning of a semiconductor integrated circuit by lithography and a resist pattern formation method using the composition, and particularly relates to a photoresist composition wherein resist properties such as resolution and pattern formation are enhanced using a light source with a wavelength of 200 nm or less, especially $F_2$ excimer laser to an extent capable of fitting in fine patterning, and a method for resist pattern formation using the composition.

BACKGROUND ART

It is not an exaggeration to say that microfabrication of semiconductor integrated circuits has been accomplished by progress of photolithography and its peripheral technology. This photolithography is supported by broadly divided two technologies as well-known. One is a exposure wavelength and numerical apertures of a reduced projection exposure apparatus called a stepper and a scanner, and the other is a resist property which is mainly transfer resolution of a photoresist composition, where a mask pattern is transferred by the reduced projection exposure apparatus. These have interacted as if both wheels of a vehicle to improve processing precision of semiconductor integrated circuit patterns by photolithography.

A wavelength of a light source used for the reduced projection exposure apparatus has been shortened more and more because of request for high resolution of the circuit pattern. In general, at a resist resolution of about 0.5 µm, g-ray having 436 nm of a major spectrum of a mercury lamp is used; at about 0.5 to 0.30 µm, i-ray having 365 nm of the major spectrum of the mercury lamp is used; at about 0.30 to 0.15 µm, KrF excimer laser light of 248 nm is used; and at 0.15 µm or less, ArF excimer laser light of 193 nm is used. For more finely shortening, the use of $F_2$ excimer laser light of 157 nm, $Ar_2$ excimer laser light of 126 nm and EUV (extreme-ultraviolet radiation, wavelength 13 nm) has been investigated.

Meanwhile, with respect to photoresist compositions, at present, combined organic or inorganic anti-reflection films and innovated lighting systems are available, lifetime of photoresists for KrF is prolonged in lithography using the KrF excimer laser light, and development of photoresist compositions which bring about 110 nm of λ/2 or less has been conducted. In the lithography using the ArF excimer laser light, it has been desired to provide photoresist compositions for ArF, which is suitable for future mass production of about 90 nm nodes or less. The lithography using the $F_2$ excimer laser light attracts the attention as one which takes on future microfabrication technology of 65 nm or less, and the development of photoresist compositions capable of significantly applying to the microfabrication by the lithography using this $F_2$ excimer laser light has been also advanced.

As well-known, in the lithography, light with short wavelength is irradiated (exposure) on a photoresist layer applied on a laminated semiconductor substrate through a mask which reflects a negative or positive image pattern of the semiconductor integrated circuit pattern to be realized. The photoresist composition contains a photosensitive polymer as a major ingredient, which reacts with the irradiated light to become insoluble (negative) or soluble (positive) in alkali. Heating (post exposure bake, also abbreviated as "PEB") to assure the reaction of the resist layer by the exposure after the irradiation of pattern light is conducted, and subsequently development is conducted to remove a soluble portion, thereby forming a photoresist pattern layer which accurately reflects the circuit pattern to be realized on the laminated semiconductor substrate. Thereafter, the patterned photoresist layer is sufficiently cured by heating (post bake) to give resistance to etching at next step in some cases. In the etching step, a surface layer or an upper layer of the laminated semiconductor substrate is dry-etched along the pattern using the patterned photoresist layer as the mask.

Therefore, major properties required for the photoresist composition are, first to obtain the resolution, therefore to have "transparency for irradiated light" where the pattern irradiated light can reach not only a surface portion of the resist layer but also a bottom portion of the substrate side and the resist layer can be significantly exposed over a whole thickness to the bottom portion, and to obtain the pattern with high resolution by an alkali developer by definitely differentiating an alkali soluble portion and an alkali insoluble portion after being irradiated with the pattern light. When the resist composition corresponding to the irradiated light with shorter wavelength than the above is developed, it is of course important to assure these major properties. High transparency at 157 nm which is a major spectrum of $F_2$ excimer laser light is required for a base polymer of the resist composition usable for the lithography by the $F_2$ excimer laser light which will become the light source of the stepper in next generation. However, existing resist materials have an absorbance just at this wavelength of 157 nm, i.e., no resist composition in the next generation can be obtained from the existing resist materials because the transparency is low for the irradiated light with a wavelength of 157 nm.

This way, in the technical field to provide the photoresist compositions, the development of a novel polymer having the high transparency at this wavelength of 157 nm is currently a problem. Up to now, the transparency for the irradiated light whose major spectrum is 157 nm is assured by introducing fluorine (F) and silicon (Si), as well as the development of novel polymers which combine resist performances such as alkali solubility, pattern transfer resolution and etching resistance, which affect a development property after the exposure has been advanced. As promising base polymers, numerous polymers such as fluorine-containing norbornene polymers (Non-patent Document 1 [M. K. Crawford, et al., "New Material for 157 nm Photoresists: Characterization and Properties" Proceedings of SPIE, Vol. 3999, (2000) pp 357-364] and Patent Document 1 (International Publication WO 00/67072 Pamphlet), fluorine-containing monocyclic polymers (Patent Document 2 [JP 2002-90997 A] and Non-patent Document 2 [Shun-ichi Kodama, et al., "Synthesis of Novel Fluoropolymer for 157 nm Photoresists by Cyclo-polymerization" Proceedings of SPIE, Vol. 4690, (2002) pp 76-83)]), tetrafluoroethylene copolymers (Non-patent Document 1 and Patent Document 1), and fluorine-containing monocyclic polymers (Non-patent Document 2) formed by cyclic polymerization of 1,1,2,3,3-pentafluoro-4-trifluoromethyl-4-hydroxy-1,6-heptadiene have been reported.

The fluorine-containing norbornene polymer (abbreviated as a conventional polymer A) disclosed in Patent Document 1 and Non-patent Document 1 and the fluorine-containing monocyclic polymer (abbreviated as a conventional polymer B) disclosed in Patent Document 2 and Non-patent Document 2 are believed to be promising as the base polymer for the photoresist composition in the next generation.

In the Non-patent Document 1, as specific examples of the conventional polymer A, a copolymer (abbreviated as a conventional polymer A1) composed of tetrafluoroethylene (49% by weight)/norbornene (51% by weight), a ternary copolymer (abbreviated as a conventional polymer A2) composed of tetrafluoroethylene (41% by weight)/norbornene (46% by weight)/vinyl acetate (12% by weight), a ternary copolymer (abbreviated as a conventional polymer A3) composed of tetrafluoroethylene (43% by weight)/norbornene (38% by weight)/vinyl acetate (20% by weight), a ternary copolymer (abbreviated as a conventional polymer A4) composed of tetrafluoroethylene (43% by weight)/norbornene (28% by weight)/vinyl acetate (29% by weight), a ternary copolymer (abbreviated as a conventional polymer A5) composed of tetrafluoroethylene (36% by weight)/norbornene (47% by weight)/t-butyl acrylate (17% by weight), a ternary copolymer (abbreviated as a conventional polymer A6) composed of tetrafluoroethylene (28% by weight)/norbornene (38% by weight)/t-butyl acrylate (34% by weight), and a ternary copolymer (abbreviated as a conventional polymer A7) composed of tetrafluoroethylene (42% by weight)/norbornene (41% by weight)/5-norbornene-2-carboxylate t-butyl ester (17% by weight) are disclosed.

This Non-patent Document 1 has taught that it is necessary to make an absorption coefficient (optical constant) of a resist film with normalized film thickness be 2.5 ($\mu m^{-1}$) or less in order to obtain the sufficient pattern transfer resolution by the exposure light with a wavelength of 157 nm. The measured optical constants of the aforementioned polymers are 1.3 (conventional polymer A1), 2.0 (conventional polymer A2), 2.1 (conventional polymer A3), 2.6 (conventional polymer A4), 2.4 (conventional polymer A5), and 3.6 (conventional polymer A6), which are almost good values (conventional polymer A7 is not measured). Therefore, this conventional polymer A is acceptable as the base polymer of the next generation resist composition in terms of transparency when the laser light with a wavelength of 157 nm is exposed.

Meanwhile in Patent Document 1, as specific examples of the conventional polymer A, many examples are disclosed, and examples thereof may include a binary copolymer (conventional polymer A8) composed of tetrafluoroethylene (0.3 mol)/hexafluoroisopropanol substituted norbornene (0.2 mol) as the binary copolymer, and a ternary copolymer (conventional polymer A9) composed of tetrafluoroethylene (46 mol %)/hexafluoroisopropanol substituted norbornene (27 mol %)/$OCH_2C(CF_3)_2OCH_2OCH_3$ substituted norbornene (27 mol %) as the ternary copolymer. The absorption coefficient of the conventional polymer A8 in the irradiated light with a wavelength of 157 nm is 1.27 $\mu m^{-1}$ (film thickness 67.5 nm) and 1.40 $\mu m^{-1}$ (film thickness 52.3 nm), which is preferable. The absorption coefficient of the conventional polymer A9 at a wavelength of 157 nm is 2.40 $\mu m^{-1}$ (film thickness 69.2 nm) and 2.17 $\mu m^{-1}$ (film thickness 54.9 nm), and the transparency of the both is acceptable as the base polymer for the next generation resist composition. Furthermore, in this Patent Document 1, using the resulting conventional polymer A as the base polymer, a photoresist composition was prepared, this was applied on a substrate to make a resist film, and a pattern was formed on this film to examine the pattern resolution. For example, in the photoresist composition using the conventional polymer A8 as the base polymer, 1.800% by weight of 2-heptanone, 1.648% by weight of cyclohexanone, 0.080% by weight of t-butyl lithocholate and 0.160% by weight of triphenylsulfonium triflate (5% by weight of cyclohexanone solution) were added to 0.312% by weight of conventional polymer A8. The resist film was formed from this photoresist composition, and the patterned light with a wavelength of 157 nm was irradiated to form a resist pattern. For the conventional polymer A9, using this polymer as the base polymer, the resist film was formed similarly, and the patterned light with a wavelength of 157 nm was irradiated to form a resist pattern. For the polymers of the other compositions, likewise, the formation of the resist film and patterning thereof were attempted. However, in Examples for patterning, it is not disclosed at all to evaluate how degree of the resolution was realized.

Therefore, in this Patent Document 1, although it can be confirmed that the transparency of the conventional polymer A is good for the light with a wavelength of 157 nm and that the conventional polymer A is promising as the base polymer of the photoresist composition for fine lithography using the irradiation light with a wavelength of 157 nm, the pattern resolution is not unknown, i.e., it is unknown whether a line width of the resist pattern required for the actual pattern of the semiconductor integrated circuit in the next generation has been accomplished or not and that if accomplished, whether the pattern shape is good or not.

However, it is described that the tetrafluoroethylene copolymer (conventional polymer A) disclosed in the above Non-patent Document 1 and Patent Document 1 is excellent in transparency for the wavelength of 157 nm, has plasma etching resistance, has a high glass transition point and is compatible with 0.26 N tetramethyl ammonium hydroxide developer commonly used, and thus the conventional polymer A is believed to be promising as the base polymer for the photoresist compositions in the next generation.

On the other hand, the conventional polymer B disclosed in Patent Document 2 is a fluorine-containing monocyclic polymer containing a repeat unit of a cyclic structure where a monomer unit (a) of a diene type monomer composed of a compound represented by the following formula (9) or a derivative thereof and a monomer unit (b) of a fluorine-containing vinyl monomer are cyclized, and having a blocked acidic group derived from the fluorine-containing vinyl monomer.

$CH_2$=CH—X—CH=$CH_2$ (9), wherein X represents a methylene group or an oxygen atom. It is described that the derivative of the above (a) contains an alkyl substituent and a hydroxyl group substituent, and that the substituted alkyl group is preferably a lower alkyl group having 1 to 4 carbon atoms.

In Patent Document 2, as specific examples of the conventional polymer B, four synthesis examples are disclosed.

In the synthesis example 1, 13.6 g of $CH_2$=$CHCH_2CH$=CH (represented by a monomer 1), 136.0 g of $CF_2$=$CFOCF_2CF_2C(CF_3)OCOC(CH_3)_3$ (represented by a monomer 2) and 10 mL of 10% by weight of diisopropyl peroxycarbonate in trichlorotrifluoroethane solution were added into 0.3 L of trichlorotrifluoroethane solvent, heated and polymerized to yield 17.4 g of the conventional polymer B (represented by a conventional polymer B1). In this conventional polymer B1, a ratio of the monomer 1 unit/monomer 2 unit is 35/65 (mol %) and a number average molecular weight in terms of polystyrene is 10,200.

In the synthesis example 2, 14.0 g of $CH_2$=CHOCH=$CH_2$ (represented by a monomer 3), 36.08 g of the monomer 2 and 10 mL of 10% by weight of diisopropyl peroxycarbonate in trichlorotrifluoroethane solution were added into 150 g of trichlorotrifluoroethane solvent, heated and polymerized to yield 12.2 g of the conventional polymer B (represented by a conventional polymer B2). In this conventional polymer B2, a ratio of the monomer 3 unit/monomer 2 unit is 31/69 (mol %) and a number average molecular weight in terms of polystyrene is 14,500.

In the synthesis example 3, 16.8 g of $CH_2$=CHCH(OH)CH=$CH_2$ (represented by a monomer 4), 150.5 g of the monomer 2 and 10 mL of 10% by weight of diisopropyl peroxycarbonate in trichlorotrifluoroethane solution were added into 150 g of trichlorotrifluoroethane solvent, heated and polymerized to yield 10.8 g of the conventional polymer B (represented by a conventional polymer B3). In this conventional polymer B3, a ratio of the monomer 4 unit/monomer 2 unit is 38/62 (mol %) and a number average molecular weight in terms of polystyrene is 12,300.

In the synthesis example 4, 13.6 g of the monomer 1, 117.9 g of $CF_2=CFOCF_2CF_2C(CF_3)(CH_3)OCOC(CH_3)_3$ (represented by a monomer 5) and 10 mL of 10% by weight of diisopropyl peroxycarbonate in trichlorotrifluoroethane solution were added into 150 g of trichlorotrifluoroethane solvent, heated and polymerized to yield 9.4 g of the conventional polymer B (represented by a conventional polymer B4). In this conventional polymer B4, a ratio of the monomer 1 unit/monomer 5 unit is 39/61 (mol %) and a number average molecular weight in terms of polystyrene is 11,800.

Furthermore in this Patent Document 2, using the resulting conventional polymer B as the base polymer, a photoresist composition was prepared and applied on a substrate to make a resist film, and a pattern was formed on this film to examine the pattern resolution. That is, 100 parts by weight of each conventional polymer B1 to B4 and 5 parts by weight of trimethylsulfonium triflate were dissolved in 700 parts by weight of propyleneglycol monomethylether acetate to obtain a resist composition, this composition was uniformly applied on a silicon substrate by spin coating, and heated at 80° C. to obtain a resist film of 0.3 µm (300 nm). Values of a transmittance of the irradiation light with a wavelength of 197 nm through the resist films corresponding to the conventional polymers B1 to B4 are described to have been 72%, 68%, 65% and 71%, respectively. For the resolution thereof, it is described that dimensions of 0.25 µm (250 nm), 0.25 µm (250 nm), 0.24 µm (240 nm) and 0.24 µm (240 nm) were possible in line and space pattern.

This way, in Patent Document 2, the resolution of the line and space pattern with 0.24 to 0.25 µm (250 nm) at a resist film thickness of 0.3 µm (300 nm) has been obtained, but no exposure by the light with a wavelength of 157 nm of $F_2$ excimer laser was conducted, and the transparency (optical constant) for the light with a wavelength of 157 nm and the resolution of the resist pattern have been unknown. An assumed resist film thickness when using the $F_2$ excimer laser is 120 to 150 nm, and the desired resolution when the line and space pattern is formed is 150 nm or less, and preferably 100 nm or less. With respect to a desired transparent degree of the resist film, as described in the Non-patent Document 1, it is necessary to make an absorption coefficient (optical constant) of a resist film with normalized film thickness be 2.5 ($\mu m^{-1}$) or less in order to obtain the sufficient pattern transfer resolution by the light exposure with a wavelength of 157 nm.

Therefore, in this Patent Document 2, although it can be confirmed that the transparency of the conventional polymer B is preferable for the light with a wavelength of 193 nm and that the conventional polymer B is promising as the base polymer of the photoresist composition for fine lithography using the irradiation light with a wavelength of 193 nm, the pattern resolution is not unknown, i.e., it is unknown how degree of the transparency for the irradiation light with a wavelength of 157 nm required for the actual pattern of the semiconductor integrated circuit in the next generation is, whether the line width of the desired resist pattern can be accomplished by this irradiation light with a wavelength of 157 nm, and that if accomplished, whether the pattern shape is good or not.

In Non-patent Document 2, for the fluorine-containing monocyclic polymer formed by cyclic polymerization of 1,1,2,3,3-pentafluoro-4-trifluoromethyl-4-hydroxy-1,6-heptadiene, the absorption coefficient, Tg, solubility in the developer and solubility in the resist solvent were evaluated, it was confirmed that such properties were preferable, and the resist composition was prepared to form the resist pattern of 100 nm.

From these results, it can be confirmed that the polymer is promising as the base polymer of the photoresist composition for the fine lithography using the irradiation light with a wavelength of 157 nm, as is the case with the conventional polymer A.

On the other hand, in Patent Document 1, it is described to add publicly known dissolution inhibitor such as tert-butyl ester of lithocholic acid.

However, even though the resist patterns of 90 nm and 80 nm may be resolved using the above conventional polymer A or B and the certain dissolution inhibitor in combination, the resist pattern shape is insufficient because a resist top portion becomes round. As described in the conventional art, practical application of the resist pattern of 70 nm or less is aimed because the lithography using the $F_2$ excimer laser attracts the attention as one which will take on the micro fabrication technology of 65 nm or less in future. However, in the resist pattern of 80 nm or less, roundness of the resist top portion will be further worse. Therefore, it is an important subject to solve the problem.

On the other hand, it is described that the tetrafluoroethylene copolymer (conventional polymer C) disclosed in the above Non-patent Document 1 and Patent Document 1 is excellent in transparency for the wavelength of 157 nm, has plasma etching resistance, has a high glass transition point and is compatible with 0.26 N tetramethyl ammonium hydroxide developer commonly used, and thus it is believed to be promising as the base polymer for the photoresist compositions in the next generation.

In the Non-patent Document 1, as specific examples of the conventional polymer C, a copolymer (conventional polymer C1) composed of tetrafluoroethylene (49% by weight)/norbornene (51% by weight), a ternary copolymer (conventional polymer C2) composed of tetrafluoroethylene (41% by weight)/norbornene (46% by weight)/vinyl acetate (12% by weight), a ternary copolymer (conventional polymer C3) composed of tetrafluoroethylene (43% by weight)/norbornene (38% by weight)/vinyl acetate (20% by weight), a ternary copolymer (conventional polymer C4) composed of tetrafluoroethylene (43% by weight)/norbornene (28% by weight)/vinyl acetate (29% by weight), a ternary copolymer (conventional polymer C5) composed of tetrafluoroethylene (36% by weight)/norbornene (47% by weight)/t-butyl acrylate (17% by weight), a ternary copolymer (conventional polymer C6) composed of tetrafluoroethylene (28% by weight)/norbornene (38% by weight)/t-butyl acrylate (34% by weight), and a ternary copolymer (conventional polymer C7) composed of tetrafluoroethylene (42% by weight)/norbornene (41% by weight)/5-norbornene-2-carboxylate t-butyl ester (17% by weight) are disclosed.

This Non-patent Document 1 has taught that it is necessary to make an absorption coefficient (optical constant) of a resist film with normalized film thickness be 2.5 ($\mu m^{-1}$) or less in order to obtain the sufficient pattern transfer resolution by the exposure with a wavelength of 157 nm. The measured optical constants of the aforementioned polymers are 1.3 (conventional polymer C1), 2.0 (conventional polymer C2), 2.1 (conventional polymer C3), 2.6 (conventional polymer C4), 2.4 (conventional polymer C5), and 3.6 (conventional polymer C6), which are almost preferable values (conventional polymer C7 is not measured). Therefore, this conventional polymer C is acceptable as the base polymer for the next generation resist composition in terms of transparency when the laser light with a wavelength of 157 nm is exposed.

Meanwhile in Patent Document 1, as specific examples of conventional polymer C, many examples are disclosed, and examples thereof may include a binary copolymer (hereinafter, described as conventional polymer C8) composed of tetrafluoroethylene (0.3 mol)/hexafluoroisopropanol substituted norbornene (0.2 mol) as the binary copolymer and a ternary copolymer (hereinafter, described as conventional polymer C9) composed of tetrafluoroethylene (46 mol %)/hexafluoroisopropanol substituted norbornene (27 mol %)/OCH$_2$C(CF$_3$)$_2$OCH$_2$OCH$_3$ substituted norbornene (27 mol %) as the ternary copolymer. The absorption coefficient of the conventional polymer C8 in the irradiated light with a wavelength of 157 nm is 1.27 µm$^{-1}$ (film thickness 67.5 nm) or 1.40 µm$^{-1}$ (film thickness 52.3 nm), which is preferable. The absorption coefficient of the conventional polymer C9 at a wavelength of 157 nm is 2.40 µm$^{-1}$ (film thickness 69.2 nm) or 2.17 µm$^{-1}$ (film thickness 54.9 nm), and the transparency of the both is acceptable as the base polymer for the next generation resist composition. Furthermore, in this Patent Document 1, using the resulting conventional polymer C as the base polymer, a photoresist composition was prepared, this was applied on a substrate to make a resist film, and a pattern was formed on this film to examine the pattern resolution. For example, in the photoresist composition using the conventional polymer C8 as the base polymer, 1.800% by weight of 2-heptanone, 1.648% by weight of cyclohexanone, 0.080% by weight of t-butyl lithocholate and 0.160% by weight of triphenylsulfonium triflate (5% by weight of cyclohexanone solution) were added to 0.312% by weight of the conventional polymer C8. The resist film was formed from this photoresist composition, and the pattern light with a wavelength of 157 nm was irradiated to form a resist pattern. For the conventional polymer C9, using this polymer as the base polymer, the resist film was formed similarly, and the light with a wavelength of 157 nm was irradiated to form a resist pattern. For the polymers of the other compositions, likewise, the formation of the resist film and patterning thereof were attempted. However, in the Examples for patterning, it is not disclosed at all to evaluate how degree of the resolution was realized.

Therefore, in this Patent Document 1, although it can be confirmed that the transparency of the conventional polymer C is preferable for the light with a wavelength of 157 nm and that the conventional polymer C is promising as the base polymer of the photoresist composition for fine lithography using the irradiation light with a wavelength of 157 nm, the pattern resolution is not unknown, i.e., it is unknown whether a line width of the resist pattern required for the actual pattern of the semiconductor integrated circuit in the next generation has been accomplished and that if accomplished, whether the pattern shape is good or not.

In Non-patent Document 2, for the fluorine-containing monocyclic polymer (hereinafter, described as conventional polymer D) formed by cyclic polymerization of 1,1,2,3,3-pentafluoro-4-trifluoromethyl-4-hydroxy-1,6-heptadiene, the absorption coefficient, Tg, solubility in the developer and solubility in the resist solvent were evaluated, it was confirmed that such properties were preferable, and the resist composition was prepared to form the resist pattern of 100 nm.

From these, it can be confirmed that the polymer is promising as the base polymer of the photoresist composition for the fine lithography using the irradiation light with a wavelength of 157 nm, as is the case with the conventional polymer A.

On the other hand, in the following Patent Document 3 (JP 2003-2925 A), it is described to add a publicly known nitrogen-containing compound to a resist for F$_2$.

However, even though the resist patterns of 90 nm and 80 nm may be resolved using the above conventional polymer C or D (hereinafter, conventional polymers C and D and the conventional polymers A and B are collectively referred to as "conventional polymers") and the certain nitrogen-containing compound in combination, the resist pattern shape is insufficient because a resist top portion becomes round. As described in the conventional art, practical application of the resist pattern of 70 nm or less is aimed because the lithography using the F$_2$ excimer laser attracts the attention as one which will take on the microfabrication technology of 65 nm or less in future. However, in the resist pattern of 80 nm or less, roundness of the resist top portion further worsens. Therefore, it is an important subject to solve the problem.

On an inorganic substrate having nitrogen-containing film such as SiON and a substrate provided with an organic anti-reflection film, the resolution and the pattern shape are insufficient in some cases.

DISCLOSURE OF INVENTION

The present invention has been made in the light of the above circumstance, and it is an object of the invention to obtain good resolution of and a good shape of a resist pattern even when an ultrafine resist pattern of 90 nm or less is formed on various substrate such as a substrate with inorganic film and a substrate provided with organic anti-reflection film. It is a subject of the invention to provide a photoresist composition having resist properties sufficiently applicable to microfabrication in next generation.

In order to solve the above subject, the present inventors have found that conventional problems may be solved and especially resist properties mainly including a pattern shape are remarkably enhanced beyond expectation by combining a polymer (A) comprising an alkali-soluble constituent unit (a1) comprising an alicyclic group having both a fluorine atom or a fluorinated alkyl group (i) and an alcoholic hydroxyl group (ii), wherein alkali solubility of the polymer is changeable by an acid action, with a specific dissolution inhibitor or nitrogen-containing compound. As such a dissolution inhibitor, a compound having a fluorine atom and having an aromatic or alicyclic group is preferable. As such a nitrogen-containing compound, the nitrogen-containing compound selected from tertiary amine (d1) having a polar group, tertiary alkylamine (d2) having 7 to 15 carbon atoms or an ammonium salt (d3) is preferable.

Since a resist composition comprising the polymer (A) as a base polymer is a resist composition of a so-called chemically amplified type, the composition contains as an essential component an acid generator which generates an acid which is a catalyst of an alkali solubilizing reaction or an alkali insolubilizing reaction of a resist after exposure.

Based on the above findings, the present inventors have prepared a photoresist composition of the present invention, formed a resist layer on a semiconductor substrate using this photoresist composition, and could form line and space of 100 nm or less and the line and space of 50 nm in the smallest fine resist pattern on this resist layer using an F$_2$ stepper, as well as also have found that a cross-sectional shape of the formed line exhibits a rectangle.

BEST MODE FOR CARRYING OUT THE INVENTION (A) Component

The polymer (A) which is a base polymer of the photoresist composition according to the present invention having the aforementioned features is a polymer comprising an alkali-soluble constituent unit (a1) comprising an alicyclic group having both a fluorine atom or a fluorinated alkyl group (i) and an alcoholic hydroxyl group (ii), wherein alkali solubility of the polymer is changeable by an acid action.

The polymer (A) of the invention is known publicly as described in Patent Document 1 and Non-patent Document 2. The polymer (A) is not limited as long as it is the polymer comprising an alkali-soluble constituent unit (a1) comprising an alicyclic group having both a fluorine atom or a fluorinated alkyl group (i) and an alcoholic hydroxyl group (ii), and alkali solubility of the polymer is changeable by the acid action.

The change of the alkali solubility by the acid action refers to the change of the polymer in an exposed portion. When the alkali solubility increases in the exposed portion, the exposed portion becomes alkali-soluble and thus is used as a positive type resist. On the other hand, when the alkali solubility is decreased in the exposed portion, the exposed portion becomes alkali-insoluble and thus it is used as a negative type resist.

The alkali-soluble constituent unit (a1) comprising the alicyclic group having both the fluorine atom or the fluorinated alkyl group (i) and the alcoholic hydroxyl group (ii) may be one where an organic group having both (i) and (ii) is bound to the alicyclic group, having the cyclic group in the constituent unit.

As the alicyclic group, groups where one or more hydrogen atoms are removed from monocyclic or polycyclic hydrocarbons such as cyclopentane, cyclohexane, bicycloalkane, tricycloalkane and tetracycloalkane may be exemplified.

More specifically, the polycyclic hydrocarbon may include groups where one or more hydrogen atoms are removed from polycycloalkane such as adamantane, norbornene, isobornane, tricyclodecane and tetracyclododecane.

Among them, groups induced by removing the hydrogen atom(s) from cyclopentane, cyclohexane and norbornane are preferable for industry.

The fluorine atom or the fluorinated alkyl group (i) may include the fluorine atom or those where a part of or all hydrogen atoms of a lower alkyl group are substituted with fluorine atoms. Specifically, trifluoromethyl, pentafluoroethyl, pentafluoropropyl, and nonafluorobutyl may be included, and the fluorine atom and trifluoromethyl group are preferable for industry.

The alcoholic hydroxyl group (ii) may be just hydroxyl group, or may include alcoholic hydroxyl group-containing alkyloxy groups, alcoholic hydroxyl group-containing alkyloxyalkyl groups or alcoholic hydroxyl group-containing alkyl groups such as alkyloxy group having hydroxyl group, alkyloxyalkyl group having hydroxyl group or alkyl group having hydroxyl group. The alkyloxy group, the alkyloxyalkyl group and the alkyl group may include lower alkyloxy, lower alkyloxy lower alkyl, and lower alkyl.

The lower alkyloxy group may specifically include methyloxy, ethyloxy, propyloxy and butyloxy, the lower alkyloxy lower alkyl group may specifically include methyloxymethyl, ethyloxymethyl, propyloxymethyl and butyloxymethyl, and the lower alkyl group may specifically include methyl, ethyl, propyl and butyl.

In the aforementioned alcoholic hydroxyl group-containing alkyloxy groups, alcoholic hydroxyl group-containing alkyloxyalkyl groups or alcoholic hydroxyl group-containing alkyl groups of (ii), a part of or all hydrogen atoms of the alkyloxy, alkyloxyalkyl or alkyl groups may be substituted with fluorine atoms. Preferably, those where a part of hydrogen atoms in an alkyloxy moiety in the alcoholic hydroxyl group-containing alkyloxy groups or the alcoholic hydroxyl group-containing alkyloxyalkyl groups is substituted with fluorine atoms, those where a part of hydrogen atoms in an alkyl moiety in the alcoholic hydroxyl group-containing alkyl groups is substituted with fluorine atoms, i.e., alcoholic hydroxyl group-containing fluoroalkyloxy, alcoholic hydroxyl group-containing fluoroalkyloxyalkyl or alcoholic hydroxyl group-containing fluoroalkyl may be included.

The alcoholic hydroxyl group-containing fluoroalkyloxy groups may include $(HO)C(CF_3)_2CH_2O$-group (2-bis(hexafluoromethyl)-2-hydroxy-ethyloxy group, and $(HO)C(CF_3)_2CH_2CH_2O$-group (3-bis(hexafluoromethyl)-3-hydroxy-propyloxy group. The alcoholic hydroxyl group-containing fluoroalkyloxyalkyl groups may include $(HO)C(CF_3)_2CH_2O$—$CH_2$-group and $(HO)C(CF_3)_2CH_2CH_2O$—$CH_2$-group. The alcoholic hydroxyl group-containing fluoroalkyl groups may include $(HO)C(CF_3)_2CH_2$-group (2-bis(hexafluoromethyl)-2-hydroxy-ethyl group and $(HO)C(CF_3)_2CH_2CH_2$-group (3-bis(hexafluoromethyl)-3-hydroxy-propyl group.

These groups of (i) and (ii) may be directly bound to the alicyclic group. In particular, a unit represented by the following general formula (10) formed by binding the alcoholic hydroxyl group-containing fluoroalkyloxy group, the alcoholic hydroxyl group-containing fluoroalkyloxyalkyl group or the alcoholic hydroxyl group-containing fluoroalkyl group in the constituent unit (a1) to a norbornene ring and cleaving a double bond of the norbornene ring is preferable because this is excellent in transparency, alkali solubility and dry-etching resistance and easily available industrially.

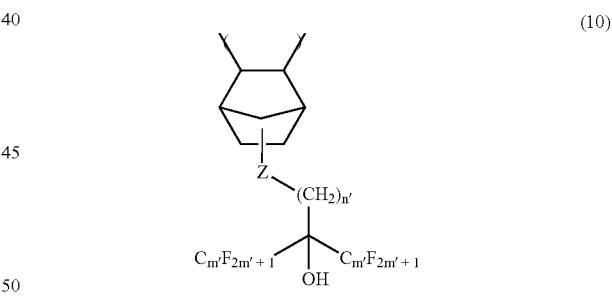

(10)

(wherein Z is an oxygen atom, oxymethylene (—O(CH$_2$)—), or a single bond, and n' and m' are each independently integers of 1 to 5.)

A polymer unit used by combining with such an (a1) unit is not particularly limited, and those known publicly may be used. When the polymer (A-1) where the alkali solubility is increased by the action of a positive type acid is used, a constituent unit (a2) derived from (meth)acrylate ester having a publicly known acid-dissociative dissolution inhibiting group is preferable because the resolution is excellent.

Such a constituent unit (a2) may include constituent units derived from tertiary alkyl ester of (meth)acrylic acid such as tert-butyl (meth)acrylate and tert-amyl (meth)acrylate.

The polymer (A) of the present invention may be the polymer (A-2) comprising a fluorinated alkylene constituent unit (a3) which further enhances the transparency of the polymer, whose alkali solubility is increased by the acid action. The transparency is further enhanced by containing such a constituent unit (a3). As the constituent unit (a3), a unit derived from tetrafluoroethylene is preferable.

General formulae (11) and (12) which represent the polymers (A-1) and (A-2) are shown below, respectively.

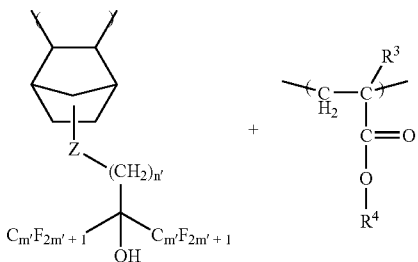

(wherein Z, n' and m' are the same as defined in the above general formula (10), $R^3$ is a hydrogen atom or methyl, and $R^4$ is an acid-dissociative dissolution inhibiting group.)

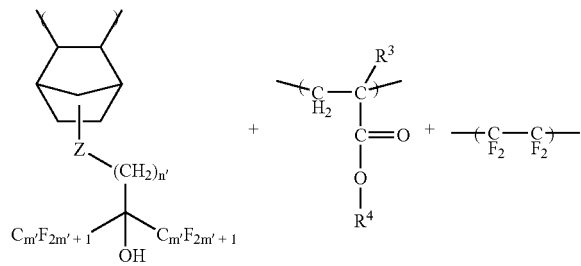

(wherein, Z, n' and m' are the same as defined in the above general formula (11).)

The polymers may also be those which have different structural formulae from the polymers (A-1) and (A-2) comprising the aforementioned general formula (10) but have constituent unit that falls in the scope of the polymer comprising an alkali-soluble constituent unit (a1) comprising an alicyclic group having both a fluorine atom or a fluorinated alkyl group (i) and an alcoholic hydroxyl group (ii), whose alkali solubility is changeable by an acid action. Examples thereof may be those containing the following constituent unit.

That is, the constituent unit (a1) may be those in which the fluorine atom or the fluorinated alkyl group (i) and the alcoholic hydroxyl group (ii) are each bound onto the alicyclic group, and the cyclic group constitutes a main chain.

The fluorine atom or the fluorinated alkyl group (i) may include the same as those described above, and the alcoholic hydroxyl group (ii) is just hydroxyl group.

The polymer (A) having such a unit is one described in Non-patent Document 2, and is formed by cyclic polymerization of a diene compound having hydroxyl group and fluorine atoms. As the diene compound, heptadiene which easily forms a polymer having a 5- or 6-membered ring which is excellent in transparency and dry-etching resistance is preferable, and the polymer formed by cyclic polymerization of 1,1,2,3,3-pentafluoro-4-trifluoromethyl-4-hydroxy-1,6-heptadiene [$CF_2=CFCF_2C(CF_3)(OH)CH_2CH=CH_2$] is the most preferable for industry.

When the polymer (A-3) whose alkali solubility is increased by the action of the positive type acid is used, the polymer comprising a constituent unit (a4) where a hydrogen atom of alcoholic hydroxyl group thereof is substituted with an acid-dissociative dissolution inhibiting group is preferable. As the acid-dissociative dissolution inhibiting group, straight, branched or cyclic alkyloxymethyl group having 1 to 15 carbon atoms is preferable in terms of acid dissociation, and in particular, lower alkoxymethyl such as methoxymethyl is excellent in resolution and pattern shape and thus is preferable. The acid-dissociative dissolution inhibiting group is preferably in the range of 10 to 40%, and more preferably 15 to 30% based on total hydroxyl groups because pattern forming ability is excellent.

The general formula (13) which represents the polymer (A-3) is shown below.

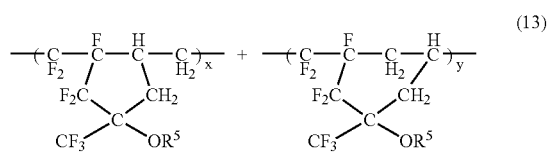

(wherein $R^5$ is a hydrogen atom or alkyloxymethyl group of C1 to C15, and x and y are each 10 to 50 mol %.)

Such a polymer (A) may be synthesized by methods known publicly and methods described in Patent Document 1 and Non-patent Document 2. A weight average molecular weight in terms of polystyrene of resin of the (A) component by GPC is not particularly limited, but is described to be 5000 to 80000, and more preferably 8000 to 50000.

The (A) component may be composed of one or more resins, for example, two or more selected from (A-1), (A-2) and (A-3) described above may be used in mixture, and furthermore, it is possible to use resins known conventionally and publicly for the photoresist compositions in mixture.

(B) Component

As a (B) component, it is possible to appropriately select and use any one known publicly as an acid generator in both positive and negative type of conventional chemically amplified type resists. Various acid generators have been proposed. In particular, onium salts such as diphenyliodonium trifluorometanesulfonate, (4-methoxyphenyl)phenyliodonium trifluorometanesulfonate, bis(p-tert-butylphenyl)iodonium trifluorometanesulfonate, triphenylsulfonium trifluorometanesulfonate, (4-methoxyphenyl)diphenylsulfonium trifluorometanesulfonate, (4-methylphenyl)diphenylsulfonium nonafluorobutanesulfonate, (p-tert-butylphenyl) diphenylsulfonium trifluorometanesulfonate, diphenyliodonium nonafluorobutanesulfonate, bis(p-tert-butylphenyl)iodonium nonafluorobutanesulfonate and triphenylsulfonium nonafluorobutanesulfonate are preferable. Among them, sulfonium salts having fluorinated alkyl sulfonate ion as anion have appropriate acid intensity, and diffusiblity in the resist film and thus are preferable.

This (B) component may be used alone or in combination of two or more. An amount thereof to be formulated is described to be, for example, 0.5 to 30 parts by weight based on 100 parts by weight of the (A) component. When the amount is less than this range, a latent image is insufficiently formed whereas when it is more than this range, it is likely to impair storage stability as the resist composition.

Additionally, the photoresist composition of the present invention contains at least one of either the following (C) and (D) components as the essential component.

(C) Component

The dissolution inhibitor having a fluorine atom(s), which is the (C) component may include compounds where a part of hydrogen atoms of hydroxyl group in phenol, alcohol or carboxylic acid of the low molecular phenol, alcohol or carboxylate compound preferably having a low molecule of 100 or more and 500 or less, where at least one fluorine is bound and the solubility in an alkali developer is increased by the acid action is substituted with substituents (acid-dissociative dissolution inhibiting groups) which are unstable for acid and have dissolution inhibiting ability for alkali.

Examples of such an acid-dissociative substituent may include tertiary alkyl, tertiary alkoxycarbonyl, tertiary alkoxycarbonylalkyl, and chain or cyclic alkoxyalkyl.

Specifically, tertiary alkyl group such as tert-butyl, tertiary alkoxycarbonyl group such as tert-butoxycarbonyl, tertiary alkoxycarbonylalkyl group such as tert-butoxycarbonylmethyl and straight, branched, or cyclic alkyloxymethyl groups such as methoxymethyl, tert-amyloxymethyl and 4-tert-butyl-cyclohexyloxymethyl having 1 to 15 carbon atoms may be included.

Examples of such compounds may include compounds represented by the general formulae (1) and (2):

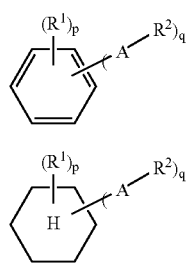

(wherein $R^1$ is a hydrogen atom, alkyl, alkoxy or a fluorine atom, $R^2$ is an acid-dissociative dissolution inhibiting group, A is $-C(C_nF_{2n+1})(C_mF_{2m+1})-O-CO-O-$, $C(C_nF_{2n+1})(C_mF_{2m+1})-O-$ or $-O-CO-O-$, and n, m, p and q are each independently integers of 1 to 4; but when A is $-O-CO-O-$, $R^1$ is the fluorine atom.) Specific examples of the compounds represented by these general formulae may include the compounds represented by the following chemical formulae (3) to (8):

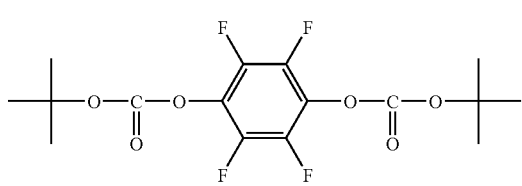

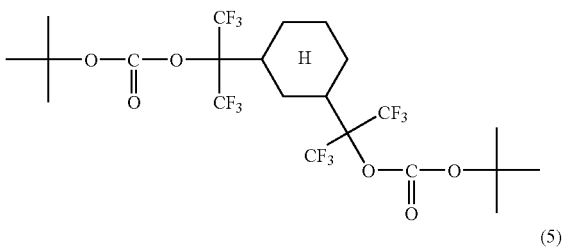

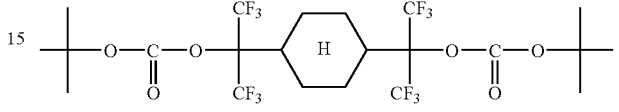

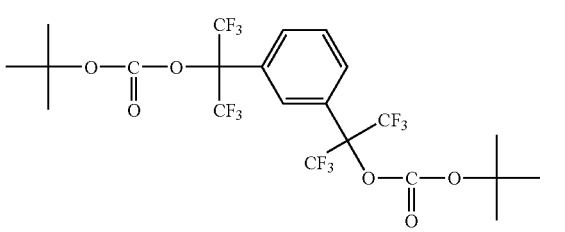

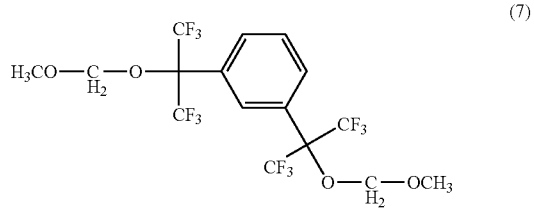

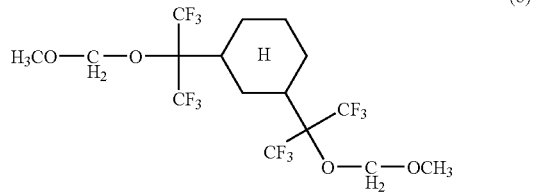

The other specific compounds may include 3,3',5,5'-tetrafluoro[(1,1'-biphenyl)-4,4'-di-t-butoxycarbonyl], 4,4'-[2,2,2-trifluoro-1-(trifluoromethyl)ethylidene]bisphenol-4,4'-di-t-butoxycarbonyl, 2-trifluoromethylbenzene carboxylate 1,1-t-butyl ester and 2-trifluoromethylcyclohexane carboxylate-t-butyl ester.

Among them, the compounds represented by the above (3) to (8) are preferable because the transparency is high and fine pattern shape is excellent.

As the acid-dissociative dissolution inhibiting group $R^2$, straight, branched or cyclic alkyloxymethyl or tertiary alkyl group having 1 to 15 carbon atoms are preferable. Among them, the compounds represented by the above chemical formulae (6) and (7).

In the photoresist compound of the present invention, the amount of the dissolution inhibitor to be added is 2 to 30 parts by weight, and preferably 3 to 10 parts by weight based on 100 parts by weight of the major component polymer (A) component. When the amount to be added is less than 2 parts by weight, no dissolution inhibitory effect appears. Conversely when the amount to be added is more than 30 parts by weight, heat resistance of the resist is reduced.

The dissolution inhibitor remarkably enhances the transparency for the light with a wavelength of 157 nm by containing the fluorine atom(s). The present inventors have confirmed that the pattern resolution is remarkably enhanced when the type having the fluorine atom(s) is used as the dissolution inhibitor, by comparing the dissolution inhibitor having the fluorine atom(s) with the dissolution inhibitor having no fluorine atom. In the resist composition of the present invention containing the aforementioned (C) component, amines and ammonium salts which serve to prevent diffusion more than needs of the acid generated in the exposed portion by the irradiation of the pattern light may be added, and the addition thereof is desirable. As the amines, amine having hydroxyl or amine salts are suitable.

The amines may include aliphatic secondary amine such as diethylamine, dipropylamine, dibutylamine and dipentylamine; aliphatic tertiary amine such as trimethylamine, triethylamine, tripropylamine, tributylamine, tripentylamine, N,N-dimethylpropylamine and N-ethyl-N-methylbutylamine; tertiary alkanol amine such as N,N-dimethylmonoethanolamine, N,N-diethylmonoethanolamine and triethanolamine; aromatic tertiary amine such as N,N-dimethylaniline, N,N-diethylaniline, N-ethyl-N-methylaniline, N,N-dimethyltoluidine, N-methyldiphenylamine, N-ethyldiphenylamine, N-ethyldiphenylamine and triphenylamine in addition to triisopropanolamine used in Example of the present invention.

As the amine salts, amine salts derived from the amine may be used in addition to ammonium salts such as tetrabutylammonium lactate used in Example of the invention.

Among them, lower tertiary alkanol amine such as triethanolamine, triisopropanolamine and tributanolamine; trialkylamine such as trihexylamine, triheptylamine, trioctylamine, tridecanylamine, tridodecylamine and tritetradecanylamine having 6 or more and 15 or less of carbon atoms; salts of quaternary alkylammonium ion such as ammonium ion, tetramethylammonium ion, tetraethylammonium ion, tetrapropylammonium ion, tetrabutylammonium ion and tetrapentylammonium ion with ion of organic carboxylic acid such as lactic acid having hydroxyl group are preferable because they are excellent in lowering effect on film reduction in a resist pattern top portion. Three alkyl groups which are bound to nitrogen in the trialkylamine may be the same or different as long as they are alkyl groups having 6 or more and 15 or less of carbon atoms.

The amines and the ammonium salts in the photoresist composition of the present invention comprising (C) component may be used alone or in combination of two or more. The amount of the amines and the ammonium salts to be added is suitably about 0.01 to 2 parts by weight based on 100 parts by weight of the major component polymer (A). When the amount thereof to be added is less than 0.01 parts by weight, no effect by the addition can be anticipated. Conversely, when the amount is more than 2 parts by weight, it is not preferable because sensitivity is deteriorated.

In the present invention, for the purpose of preventing the deterioration of sensitivity by the addition of the amines and the ammonium salts, an organic carboxylic acid or an oxo acid of phosphorus or a derivative thereof may be contained as an optional component.

As the organic carboxylic acid, for example, malonic acid, citric acid, malic acid, succinic acid, benzoic acid and salicylic acid are suitable.

The oxo acid of phosphorus or the derivative thereof may include phosphoric acid or their derivatives such as ester thereof such as phosphoric acid, di-n-butyl phosphate ester and diphenyl phosphate ester, phosphonic acid and their derivatives such as ester thereof such as phosphonic acid, dimethyl phosphonate ester, phosphonate-di-n-butyl ester, phenyl phosphonate, diphenyl phosphonate ester and dibenzyl phosphonate ester, phosphinic acid and their derivatives such as ester thereof such as phosphinic acid and phenyl phosphinate, and among them, phosphonic acid is particularly preferable. The organic carboxylic acid or the oxo acid of phosphorus or the derivative thereof is used at a ratio of 0.01 to 5.0 parts by weight based on 100 parts by weight of the (A) component.

(D) Component

The (D) component has an improvement effect on particularly fine pattern shapes when used in combination with the polymer (A) of the present invention, and is a nitrogen-containing compound selected from tertiary amine (d1) having polar group, tertiary alkylamine (d2) having 6 or more and 15 or less of carbon atoms, and an ammonium salt (d3).

As the polar group in the (d1), hydroxyl group is excellent in lowering effect on film reduction in the resist pattern top portion and thus is preferable. In particular, lower tertiary alkanol amine is preferable in terms of being easily left in the resist film. Such amines may include triethanolamine, triisopropanolamine and tributanolamine.

The (d2) may include trihexylamine, triheptylamine, trioctylamine, tridecanylamine, tridodecylamine, and tritetradecanylamine, which are preferable in terms of being excellent in lowering effect on film reduction in the resist pattern top portion. Three alkyl groups which are bound to nitrogen may be the same or different as long as they are the alkyl groups having 6 or more and 15 or less of carbon atoms.

The (d3) may include salts of quaternary alkyl ammonium ion such as ammonium ion, tetramethylammonium ion, tetraethylammonium ion, tetrapropylammonium ion, tetrabutylammonium ion and tetrapentylammonium ion with organic carboxylate ion such as lactic acid having hydroxyl group, which are preferable because they are excellent in lowering effect on the film reduction in the resist pattern top portion.

These nitrogen-containing compounds are typically used in the range of 0.01 to 2 parts by weight based on 100 parts by weight of the (A) component. When the amount is less than this range, no improvement effect on the pattern shape is obtained whereas when it is more than this range, it is not preferable because the sensitivity is deteriorated.

When the (D) component is contained, a dissolution inhibitor which is a low molecular compound whose alkali solubility is increased by being decomposed (e.g., hydrolyzed) in the presence of the acid may further be added. The dissolution inhibitor may inhibit a dissolving action of an insoluble portion by the developer after the exposure. When the resist is somewhat overdeveloped, a corner portion of the pattern is easily dissolved, but if the dissolution inhibitor has been added, it is possible to inhibit the dissolution of the pattern corner portion, and thus assure the contrast of the pattern well.

The dissolution inhibitor used for the present invention may include compounds where one or more substituents capable of dissociating in the presence of acid and having a dissolution inhibiting ability for alkali are introduced into a functional group of phenolic hydroxyl group, alcoholic hydroxyl group and carboxyl group having at least one aromatic ring or aliphatic ring with a molecular weight of 200 to 500. Examples of such an acid-dissociative substituent may include tertiary alkyl, tertiary alkoxycarbonyl, tertiary alkoxycarbonylalkyl and chain or cyclic alkoxyalkyl.

Specifically, tertiary alkyl groups such as tert-butyl, tertiary alkoxycarbonyl groups such as tert-butoxycarbonyl, tertiary alkoxycarbonylalkyl groups such as tert-butoxycarbonylmethyl, chain alkoxyalkyl groups such as methoxymethyl, 1-ethoxyethyl and 1-propoxyethyl, and cyclic alkoxyalkyl groups such as tetrahydropyranyl and tetrahydrofuranyl may be included.

Such a dissolution inhibitor may include compounds where a hydrogen atom of carboxyl group of bile acid such as lithocholic acid is substituted with tertiary alkyl group and the following fluorine-containing compounds as preferable ones. In particular, the latter fluorine-containing compounds are excellent in pattern shape, and thus are preferable.

The fluorine-containing compounds may include compounds represented by the following chemical formulae:

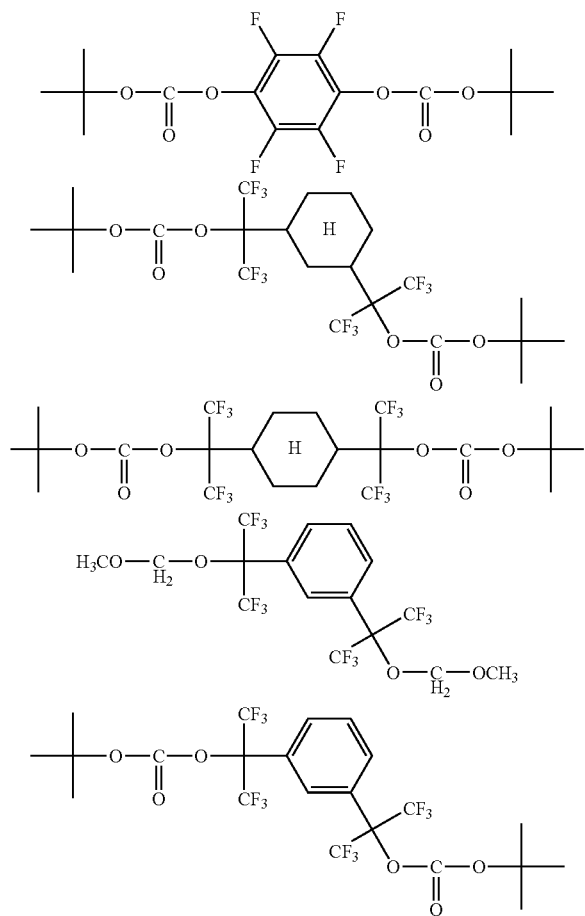

In the photoresist composition of the invention containing the (D) component, the amount of the dissolution inhibitor to be added is 2 to 30 parts by weight, and preferably 3 to 10 parts by weight based on 100 parts by weight of the major component polymer. When the amount is less than 2 parts by weight, no dissolution inhibitory effect appears. Conversely when the amount is more than 30 parts by weight, heat resistance of the resist is reduced.

In the present invention, for the purpose of preventing the deterioration of sensitivity by the addition of the (D) component, organic carboxylic acid or oxo acid of phosphorus or a derivative thereof may be contained as a optional component.

As the organic carboxylic acid, for example, malonic acid, citric acid, malic acid, succinic acid, benzoic acid and salicylic acid are suitable.

The oxo acid of phosphorus or the derivative thereof may include phosphoric acid or derivatives such as ester thereof such as phosphoric acid, di-n-butyl phosphate ester and diphenyl phosphate ester, phosphonic acid and derivatives such as ester thereof such as phosphonic acid, dimethyl phosphonate ester, phosphonate-di-n-butyl ester, phosphonate phenyl, diphenyl phosphonate ester and dibenzyl phosphonate ester, phosphinic acid and derivatives such as ester thereof such as phosphinic acid and phenyl phosphinate, and among them, phosphonic acid is particularly preferable. The organic carboxylic acid or the oxo acid of phosphorus or the derivative thereof is used at a ratio of 0.01 to 5.0 parts by weight based on 100 parts by weight of the (A) component.

The photoresist composition of the present invention is used as a homogenous solution obtained by dissolving the (A) component, the (B) component, either one of the component (C) or (D), and further optional components added if necessary in an organic solvent. Specific examples of such an organic solvent may include ketones such as acetone, methyl ethyl ketone, cyclohexanone, methyl isoamyl ketone and 2-heptanone, polyvalent alcohols and derivative thereof such as monomethyl ether, monoethyl ether, monopropyl ether, monobutyl ether or monophenyl ether of ethylene glycol, ethylene glycol monoacetate, diethylene glycol, diethylene glycol monoacetate, propylene glycol, propylene glycol monoacetate, dipropylene glycol, or dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate and ethyl ethoxypropionate. These organic solvents may be used alone or as a mixed solvent of two or more. Among them, propylene glycol monomethyl ether acetate (PGMEA) and ethyl lactate (EL) are preferable.

The amount of the organic solvent may be a concentration capable of applying on the substrate for forming the resist film.

Furthermore, in the resist composition of the invention, miscible additives as desired may be added/contained. For example, an additive resin for improving performance of the resist film, a surfactant for enhancing a coating property, a dissolution inhibitor, a plasticizer, a stabilizer, a colorant and anti-halation agent may be added/contained.

In the method for forming a resist pattern of the present invention, the resist pattern is formed by a usual lithography process using the photoresist composition described above. In such a method, first, the photoresist composition is applied on the substrate by spin-coating, and dried to form the resist film. Then, the resist film is selectively exposed through a mask pattern, and heated after the exposure. Finally, the resist film is developed by an alkali aqueous solution to form the resist pattern. A post-bake treatment may be given as needed. A light source is not limited, and far ultraviolet radiation of 200 nm or less, specifically ArF excimer laser, $F_2$ excimer laser, EUV (extreme-ultraviolet radiation), electron ray, soft X-ray and X-ray may be used as the light source. In particular, the $F_2$ excimer laser is preferable.

For the substrate, substrates provided with organic or inorganic anti-reflection film and various thin films of SiON, silicon nitride (SiN) and trisilicon tetranitride ($Si_3N_4$) are used.

EXAMPLES

The present invention will be described in more detail with reference to the following Examples. The Examples shown below are only exemplifications for preferably illustrating the invention, and do not limit the invention.

Example 1

As a copolymer (A) which was a major component of a photoresist composition of the present invention, a polymer (referred to as polymer 1) formed by cyclic polymerization of 1,1,2,3,3-pentafluoro-4-trifluoromethyl-4-hydroxy-1,6-heptadiene [$CF_2$=$CFCF_2C(CF_3)(OH)CH_2CH$=$CH_2$] and a diene compound where a hydrogen atom of its hydroxyl group had been substituted with methoxymethyl group was used.

A structural formula of this polymer is as follows. Its weight average molecular weight was 40,000.

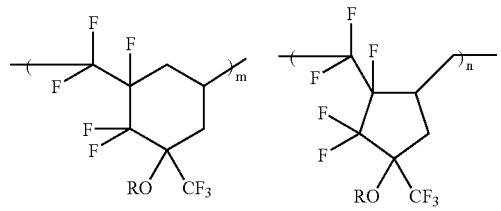

(wherein R is —CH$_2$OCH$_3$ or a hydrogen atom, a ratio of —CH$_2$OCH$_3$ was 20% in all R in the polymer, and m:n is 50 mol %: 50 mol %.)

A homogenous solution was made to afford the photoresist composition by dissolving 5 parts by weight of triphenylsulfonium nonafluorobutanesulfonate (TPS-Nf), 0.1 parts by weight of triisopropanolamine, 0.1 parts by weight of salicylic acid, 5 parts by weight of a dissolution inhibitor (dissolution inhibitor 1) represented by the following chemical formula and 100 parts by weight of this copolymer in 1100 parts by weight of propylene glycol monomethyl ether acetate (PGMEA).

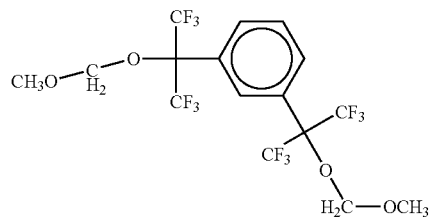

On the other hand, an organic type anti-reflection film with a film thickness of 82 nm was formed by applying an organic type anti-reflection film composition "AR-19" (trade name, supplied from Shipley) on a silicon wafer using a spinner and drying by heating on a hotplate. Subsequently, a resist layer with a film thickness of 150 nm was formed on the anti-reflection film by applying the photoresist composition obtained above on the anti-reflection film using the spinner and prebaking at 90° C. for 90 seconds on the hotplate to dry.

Subsequently, the resist layer was selectively irradiated through a phase shift mask using F$_2$ excimer laser (157 nm) by an F$_2$ excimer laser reduced projection exposure apparatus (NA [numerical apertures]=0.85, σ=0.3) supplied from Exitech. Subsequently, a PEB treatment under a condition at 110° C. for 90 seconds was given to the resist layer, which was further developed in an alkali developer at 23° C. for 60 seconds. As the alkali developer, an aqueous solution of 2.38% by weight of tetramethylammonium hydroxide was used.

A resist pattern obtained in this way was observed by a scanning electron microscope (SEM), and consequently, a line and space pattern 1:1 of 65 nm was formed and its pattern shape cross-section was highly rectangle and preferable. Sensitivity at that time was 30.5 mJ/cm$^2$. Likewise, a line and space pattern 1:1.5 of 50 nm could be formed, and its pattern shape cross-section could be also highly rectangle and excellent. The sensitivity at that time was 28 mJ/cm$^2$.

Examples 2 to 8 and Comparative Examples 1 to 4

The composition of the photoresist, the patterning condition and the exposure apparatus in Example 1 were changed to those shown in Table 1, and results of the patterning are shown in Table 1. Points which are not described in the patterning condition are the same as in Example 1.

TABLE 1

| Examples/ Comparative Examples | Resist Composition: parts by weight | Exposure Apparatus | Patterning Condition | Results |
| --- | --- | --- | --- | --- |
| Example 1 | polymer 1:100 TPS-Nf: 5 triisopropanolamine: 0.1 salicylic acid: 0.1 dissolution inhibitor 1:5 PGMEA: 1100 | F2 exposure Exitech (0.85 NA/σ0.3) | resist film thickness: 150 nm organic anti-reflection film ARI9 prebake 90° C./90 s PEB 110° C./90 s | 65 nm L/S 1:1 Sensitivity 30.5 mJ/cm2 50 nm L/S 1:1.5 Sensitivity 28 mJ/cm2 Both resist pattern and shape are rectangular. |
| Example 2 | Except for changing PGMEA to 1150, the other conditions are the same as Example 1 | Same as Example 1 | resist film thickness: 150 nm substrate having film such as SiON prebake 90° C./90 s PEB 110° C./90 s | 70 nm L/S 1:1 Sensitivity 26 mJ/cm2 Both resist pattern and shape are rectangular |
| Example 3 | polymer 1:100 TPS-Nf: 5 tetrabutylammonium lactate: 0.2 dissolution inhibitor 1:5 PGMEA: 1100 | Same as Example 1 | Same as Example 1 | 65 nm L/S 1:1 32 mJ/cm2 50 nm L/S 1:1.5 28 mJ/cm2 Both resist pattern and shape are rectangular. |

TABLE 1-continued

| Examples/Comparative Examples | Resist Composition: parts by weight | Exposure Apparatus | Patterning Condition | Results |
|---|---|---|---|---|
| Example 4 | polymer 1:100<br>TPS-Nf: 2<br>triisopropanolamine: 0.3<br>dissolution inhibitor 1:5<br>PGMEA: 900 | ArF exposure supplied from Nikon NSR-S302A NA = 0.60, ⅔ orbicular zones | resist film thickness: 190 nm substrate having film such as SiON prebake 80° C./90 s PEB 90° C./90 s | 130 nm L/S 1:1<br>Sensitivity 18 mJ/cm2<br>Resist pattern is rectangular. |
| Example 5 | polymer 1:100<br>TPS-Nf: 2<br>tri-n-hexylamine: 0.42<br>dissolution inhibitor 1:5<br>PGMEA: 900 | Same as Example 4 | resist film thickness: 190 nm anti-reflection film such as SiON prebake 80° C./90 s PEB 90° C./90 s | 130 nm L/S 1:1<br>Sensitivity 20 mJ/cm2<br>Resist pattern is rectangular. |
| Example 6 | polymer 1:100<br>TPS-Nf: 2<br>tri-n-heptylamine: 0.49<br>dissolution inhibitor 1:5<br>PGMEA: 900 | Same as Example 4 | Same as Example 5 | 130 nm L/S 1:1<br>Sensitivity 18 mJ/cm2<br>Resist pattern is rectangular. |
| Example 7 | polymer 1:100<br>TPS-Nf: 2<br>tri-n-octylamine: 0.55<br>dissolution inhibitor 1:5<br>PGMEA: 900 | Same as Example 4 | Same as Example 5 | 130 nm L/S 1:1<br>Sensitivity 19 mJ/cm2<br>Resist pattern is rectangular. |
| Example 8 | polymer 1:100<br>TPS-Nf: 2<br>tri-n-dodecylamine: 0.82<br>dissolution inhibitor 1:5<br>PGMEA: 900 | Same as Example 4 | Same as Example 5 | 130 nm L/S 1:1<br>Sensitivity 14 mJ/cm2<br>Resist pattern is rectangular. |
| Comparative Example 1 | polymer 1:100<br>TPS-Nf: 2<br>triethylamine: 0.16<br>dissolution inhibitor 1:5<br>PGMEA: 900 | Same as Example 4 | Same as Example 5 | 130 nm L/S 1:1<br>Sensitivity 14 mJ/cm2<br>Resist pattern shape is insufficient because a resist top portion becomes round. |
| Comparative Example 2 | polymer 1:100<br>TPS-Nf: 2<br>tri-n-pentylamine: 0.36<br>dissolution inhibitor 1:5<br>PGMEA: 900 | Same as Example 4 | Same as Example 5 | 130 nm L/S 1:1<br>Sensitivity 20.5 mJ/cm2<br>Resist pattern shape is insufficient because a resist top portion becomes round. |
| Comparative Example 3 | polymer 1:100<br>TPS-Nf: 2<br>dicyclohexylamine: 0.28<br>dissolution inhibitor 1:5<br>PGMEA: 900 | Same as Example 4 | Same as Example 5 | 130 nm L/S 1:1<br>Sensitivity 14 mJ/cm2<br>Resist pattern shape is insufficient because a resist top portion becomes round. |
| Comparative Example 4 | polymer 1:100<br>TPS-Nf: 2<br>dicyclohexylmono-methylamine: 0.31<br>dissolution inhibitor 1:5<br>PGMEA: 900 | Same as Example 4 | Same as Example 5 | 130 nm L/S 1:1<br>Sensitivity 14 mJ/cm2<br>Resist pattern shape is insufficient because a resist top portion becomes round. |

In the above Examples 2 to 8 and Comparative Examples 1 to 4, it has been shown that a vertical property of the resist pattern shape is improved by the use of the specific nitrogen-containing compound and the publicly known fluorinated copolymer in the results by the ArF excimer laser. Actually, in the results by the $F_2$ excimer laser, it has been shown from the results in Examples 1 to 3 that the resist pattern of 50 nm with the finest pattern could be formed into a good shape. From these, it is apparent to those skilled in the art that the resolution of line and space of 90 nm or less can be accomplished by lithography using irradiation light with a wavelength of 157 nm and that the good resist pattern with high vertical property is obtained.

Example 9

A photoresist composition was obtained by adding and mixing 100 parts by weight of the same fluorine-containing monocyclic polymer as used in Example 1, 2.5 parts by weight of TPS-NF (triphenylsulfonium perfluorobutane-sulfonate, 0.1 parts by weight of tri-n-dodecylamine and 0.1 parts by weight of salicylic acid in 1260 parts by weight of propylene glycol monomethyl ether acetate (PGMEA).

As a semiconductor substrate for forming a film thereon, the semiconductor substrate with a diameter of 200 mm on which an organic anti-reflection film with a thickness of 84 nm (DUV-30J, supplied from Brewer Science) had been formed was used. The resist film with a film thickness of 200 nm was obtained by uniformly applying the aforementioned photoresist composition on this anti-reflection film by spin coating, and heating at 70° C. for 90 seconds to dry.

The resist film was irradiated with light of a wavelength of 157 nm through a phase shift mask of a half tone type using an $F_2$ excimer laser exposure apparatus (supplied from Exitech, NA=0.85, σ=0.6).

After the exposure, the resist film was heated at 110° C. for 90 seconds, and it was developed in a solution of 2.38% by weight of tetramethylammonium hydroxide. A development temperature was 22° C., and a development time period was 60 seconds. After the development, the resist film was washed with deionized water, and dried.

As a result, a hole pattern with a hole diameter of 100 nm (ratio of hole to space is 1:1) was formed as a resist pattern on the substrate. An exposed dose at that time was 24.4 mJ/cm$^2$. A cross-sectional shape of a line of this pattern was observed, and consequently the shape clearly exhibited a rectangle.

In the following Examples 10 to 17 and Comparative Examples 5 to 10, the evaluation was conducted using the ArF excimer laser (wavelength 193 nm) in order to confirm effectiveness for the wavelength of 200 nm or less.

Example 10

As a copolymer (A) which was a major component of a photoresist composition of the present invention, a polymer formed by cyclic polymerization of 1,1,2,3,3-pentafluoro-4-trifluoromethyl-4-hydroxy-1,6-heptadiene [CF$_2$=CFCF$_2$C(CF$_3$)(OH)CH$_2$CH=CH$_2$] and a diene compound where a hydrogen atom of its hydroxyl group had been substituted with methoxymethyl group was used. A structural formula of this polymer is as follows. Its weight average molecular weight was 40,000. In the following formula, R$^5$ is methoxymethyl group or a hydrogen atom. Of all the R$^5$ in the polymer, 20% of the R$^5$ was the methoxymethyl group, and x and y are each 50 mol %.

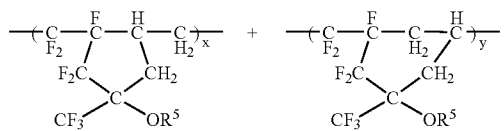

(13)

A photoresist composition was obtained by adding and mixing 100 parts by weight of this fluorine-containing monocyclic polymer, 4 parts by weight of TPS-NF (triphenylsulfonium perfluorobutanesulfonate), 0.4 parts by weight of triisopropanolamine and 5 parts by weight of a dissolution inhibitor represented by the above chemical formula (6) having fluorine atoms in 1100 parts by weight of propylene glycol monomethyl ether acetate (PGMEA).

As a semiconductor substrate for forming a resist film thereon, the semiconductor substrate on which an organic anti-reflection film with a thickness of 85 nm (AR19, supplied from Shipley) had been formed was used. The resist film with a film thickness of 250 nm was obtained by uniformly applying the aforementioned photoresist composition on this semiconductor substrate (i.e., on the anti-reflection film) by spin coating, and heating at 95° C. for 90 seconds to dry.

The aforementioned resist film was irradiated with the light with a wavelength of 193 nm through a mask using an ArF exposure apparatus S-302A (supplied from Nikon Corporation, NA=0.60, 2/3 orbicular zones).

After the exposure, the heating at 120° C. for 90 seconds was given, and subsequently the resist film was developed in the solution of 2.38% by weight of tetramethylammonium hydroxide. The development temperature was 23° C., and the development time period was 60 seconds. After the development, the resist film was washed with deionized water, and dried.

As a result, a pattern of line and space (1:1) of 120 nm was formed on the substrate. The exposed dose at that time was 13 mJ/cm$^2$. A cross-sectional shape of lines of this pattern was observed, and consequently the shape clearly exhibited a rectangle.

Example 11

The formation of a resist film, the irradiation of pattern light onto the resist film, the development and the washing were conducted by the same way as in Example 10, except that the dissolution inhibitor represented by the above chemical formula (7) having fluorine atoms in place of the dissolution inhibitor represented by the above chemical formula (6) having fluorine atoms.

As a result, a pattern of line and space (1:1) of 120 nm was formed on the substrate. The exposed dose at that time was 13 mJ/cm$^2$. A cross-sectional shape of lines of this pattern was observed, and consequently the shape clearly exhibited a rectangle.

Comparative Example 5

A photoresist composition was prepared by the same composition as in the above Example 10, except that the dissolution inhibitor having fluorine atoms was not contained as the resist composition, and the formation of a resist film, the irradiation of pattern light onto the resist film, the development and the washing were conducted by the same way as in Example 10. As a result, remarkable film reduction was observed in the pattern of line and space of 200 nm or less. A cross-sectional shape of the line had round corners and was not rectangular.

Comparative Example 6

A photoresist composition was prepared by the same composition as in Example 10, except that 5 parts by weight of tert-butyl lithocholate ester as the publicly known dissolution inhibitor was used in place of the dissolution inhibitor represented by the above chemical formula (6) having fluorine atoms as the resist composition, and the formation of a resist film, the irradiation of pattern light onto the resist film, the development and the washing were conducted by the same way as in Example 10. As a result, remarkable film reduction was observed in the pattern of line and space of 200 nm or less. A cross-sectional shape of the line had round corners and was not rectangular.

In Examples 10 and 11, the pattern of line and space of 120 nm could be formed by using for the base polymer the fluorine-containing monocyclic polymer which was promising as the base polymer for next generation resists as well as adding the dissolution inhibitor having fluorine atoms into the resist composition. And, the cross-sectional shape of the line in this pattern retains the clear rectangle, and thus it has been found that the resist film is effective for the light source with a wavelength of 193 nm.

On the contrary, in Comparative Example 5, although the composition was prepared by the same composition as in Example 10 except for adding no dissolution inhibitor having fluorine atoms, and the exposure, the development, the washing and the drying were conducted to form the pattern by the same way as in Example 10, the shape was noticeably disarranged because of the film reduction in the pattern of 200 nm or less, and the pattern was off from practical use. From this Comparative Example 5, it has been found that the fluorine-containing dissolution inhibitor is essential for the resist composition using the fluorine-containing monocyclic polymer for the base polymer.

In Comparative Example 6, the composition was prepared by the same composition as in Example 10 except for adding the publicly known dissolution inhibitor, and the exposure, the development, the washing and the drying were conducted to form the pattern by the same way as in Example 10, but the shape was noticeably disarranged because of the film reduction in the pattern of 200 nm or less, and the pattern was off from practical use.

In Examples 10 and 11, it has been confirmed that the resist composition of the present invention is effective for the ArF excimer laser. Subsequently, the evaluation was conducted using the resist composition and using an $F_2$ excimer laser exposure apparatus (Exitech, NA=0.85, σ=0.3) with a wavelength of 157 nm in Example 12 to 17.

Example 12

$F_2$ excimer laser exposure was conducted using the photoresist composition in Example 10. An anti-reflection film (AR19 supplied from Shipley) with a film thickness of 82 nm was provided on a semiconductor substrate, subsequently, the photoresist composition was uniformly applied by spin coating, heated at 110° C. for 60 seconds and dried to obtain a resist film with a film thickness of 150 nm. An optical constant of the resulting resist film for the wavelength of 157 nm was 3.0 (abs/μm) or less.

The resist film was irradiated with the $F_2$ excimer laser through the mask. After the exposure, the resist film was heated at 110° C. for 90 seconds, and subsequently the resist film was developed in the solution of 2.38% by weight of tetramethylammonium hydroxide. The development temperature was 23° C., and the development time period was 60 seconds. After the development, the resist film was washed with deionized water, and dried.

As a result, a pattern of line and space (1:1) of 65 nm was formed on the substrate. The exposed dose at that time was 30.5 mJ/cm². The line and space (1:1.5) of 50 nm was also formed. A cross-sectional shape of lines of these pattern was observed, and consequently the shape clearly exhibited a rectangle.

Example 13

The photoresist composition in Example 11 was evaluated. An anti-reflection film (AR19 supplied from Shipley) with a film thickness of 82 nm was provided on a semiconductor substrate, subsequently, the photoresist composition was uniformly applied thereon by spin coating, heated at 110° C. for 60 seconds, and dried to obtain a resist film with a film thickness of 150 nm. The optical constant of the resulting resist film for the wavelength of 157 nm was 3.0 (abs/μm) or less.

The resist film was irradiated with the $F_2$ excimer laser through the mask. After the exposure, the resist film was heated at 110° for 90 seconds, and subsequently the resist film was developed in the solution of 2.38% by weight of tetramethylammonium hydroxide. The development temperature was 23° C., and the development time period was 60 seconds. After the development, the resist film was washed with deionized water, and dried.

As a result, a pattern of line and space (1:1) of 65 nm was formed on the substrate. The exposed dose at that time was 30.5 mJ/cm². The line and space (1;1.5) of 50 nm was also formed. A cross-sectional shape of lines of these pattern was observed, and consequently the shape clearly exhibited a rectangle.

Example 14

A resist film was formed by the same way as in Example 12, except that 0.1% by weight of salicylic acid had been added to the photoresist composition in Example 12.

As a result, a pattern of line and space (1:1) of 65 nm was formed on the substrate. The line and space (1:1.5) of 50 nm was also formed. A cross-sectional shape of lines of these pattern was observed, and consequently the shape clearly exhibited a rectangle.

Example 15

A resist film was formed by the same way as in Example 13, except that 0.1% by weight of salicylic acid had been added to the photoresist composition in Example 13.

As a result, a pattern of line and space (1:1) of 65 nm was formed on the substrate. The line and space (1:1.5) of 50 nm was also formed. A cross-sectional shape of lines of these pattern was observed, and consequently the shape clearly exhibited a rectangle.

Example 16

A photoresist composition was obtained by adding and mixing 100 parts by weight of the same fluorine-containing monocyclic polymer as one used in Example 10, 5 parts by weight of TPS-NF (triphenylsulfonium perfluorobutanesulfonate), 0.1 parts by weight of triisopropanolamine, 0.1 parts by weight of salicylic acid and 5 parts by weight of the dissolution inhibitor represented by the chemical formula (6) having fluorine atoms in 1260 parts by weight of propylene glycol monomethyl ether acetate (PGMEA).

As a semiconductor substrate for forming a resist film thereon, the semiconductor substrate with a diameter of 200 mm on which an inorganic anti-reflection film SiON with a thickness of 20 nm had been formed was used. The resist film with a film thickness of 150 nm was obtained by uniformly applying the aforementioned photoresist composition on this anti-reflection film by spin coating, and heating at 90° C. for 90 seconds to dry.

The resist film was irradiated with light with a wavelength of 157 nm through a Levenson-type phase shift mask using an $F_2$ excimer laser exposure apparatus (supplied from Exitech, NA=0.85, σ=0.3).

After the exposure, the heating at 110° C. for 90 seconds was given, and the resist film was developed in the solution of 2.38% by weight of tetramethylammonium hydroxide. The development temperature was 22° C., and the development time period was 60 seconds. After the development, the resist film was washed with deionized water, and dried.

As a result, a pattern of line and space (1:1) of 65 nm was formed on the substrate. The exposed dose at that time was 26 mJ/cm². A cross-sectional shape of lines of this pattern was observed, and consequently the shape clearly exhibited a rectangle.

Example 17

A photoresist composition was obtained by adding and mixing 100 parts by weight of the same fluorine-containing monocyclic polymer as one used in Example 10, 5 parts by weight of TPS-NF5, 0.4 parts by weight of triisopropanolamine, and 5 parts by weight of the dissolution inhibitor represented by the chemical formula (6) having fluorine atoms in 1260 parts by weight of propylene glycol monomethyl ether acetate (PGMEA).

As a semiconductor substrate for forming a resist film thereon, the semiconductor substrate with a diameter of 300 mm on which an organic anti-reflection film with a thickness of 82 nm (AR19, supplied from Shipley) had been formed was used. The resist film with a film thickness of 220 nm was obtained by uniformly applying the aforementioned photoresist composition on this anti-reflection film by spin coating, and heating at 80° C. for 90 seconds to dry.

The aforementioned resist film was irradiated with the light with a wavelength of 193 nm through the mask using an ArF excimer laser exposure apparatus NSR-S305B (supplied from Nikon Corporation, NA=0.68, 2/3 orbicular zones).

After the exposure, the heating at 110° C. for 90 seconds was given, and the resist film was developed in the solution of 2.38% by weight of tetramethylammonium hydroxide. The development temperature was 22° C., and the development time period was 60 seconds. After the development, the resist film was washed with deionized water, and dried.

As a result, a pattern of line and space (1:1) of 110 nm was formed on the substrate. The exposed dose at that time was 11.2 mJ/cm$^2$. A cross-sectional shape of lines of this pattern was observed, and consequently the shape clearly exhibited a rectangle.

In this Example 17, since a silicon wafer with a diameter of 300 mm which was larger than conventional ones was used, coating uniformity on the substrate surface and uniformity (CD uniformity) of the resist pattern were also evaluated.

First, the coating uniformity was obtained as follows. that is, consecutively 13 of the above semiconductor substrates were made, and the thickness of the resist film after drying was measured for 53 points on each substrate. As a result, an average difference of film thickness between the substrates was within 1% and the film thickness difference on one substrate was within 2% for the aimed resist film thickness of 220 nm.

Subsequently, the uniformity of the resist pattern (CD uniformity) was obtained as follows. That is, consecutively 13 of the above semiconductor substrates were made, and the resist pattern was formed as the above on each substrate. Then, a size of the resist pattern was measured for 49 points. As a result, an average resist pattern size was within 2% for the aimed line and space of 110 nm.

From Example 17, it has been shown that by the use of the resist composition of the present invention, the resist film after drying was very uniformly formed even on the semiconductor substrate with a diameter of 300 mm as well as the resist pattern with good uniformity was formed by the subsequent selective exposure, post-exposure heating and development.

Comparative Example 7

A resist composition was prepared by the same way as in Comparative Example 6, except that the amount of TPS-NF was changed to 5 parts by weight, the amount of triisopropanolamine was changed to 0.1 parts by weight and 0.1 parts by weight of salicylic acid was added, and the evaluation was conducted. An anti-reflection film (AR19 supplied from Shipley) with a film thickness of 82 nm was provided on a semiconductor substrate, subsequently, the photoresist composition was uniformly applied by spin coating, heated at 90° C. for 900 seconds and dried to obtain a resist film with a film thickness of 150 nm.

The resist film was irradiated with the $F_2$ excimer laser through the mask. After the exposure, the resist film was heated at 110° for 90 seconds, and subsequently the resist film was developed in the solution of 2.38% by weight of tetramethylammonium hydroxide. The development temperature was 23° C., and the development time period was 60 seconds. After the development, the resist film was washed with deionized water, and dried.

As a result, although a pattern of line and space (1:1) of 90 nm or less was formed, film reduction in the pattern was observed and the pattern shape became round and was not rectangular. The exposed dose at that time was 26 mJ/cm$^2$. Finer pattern than that could not be formed.

Comparative Example 8

A resist composition was prepared by the same way as in Comparative Example 5, except that the amount of TPS-NF was changed to 5 parts by weight, the amount of triisopropanolamine was changed to 0.1 parts by weight and 0.1 parts by weight of salicylic acid was added, and the evaluation was conducted. An anti-reflection film (AR19 supplied from Shipley) with a film thickness of 82 nm was provided on a semiconductor substrate, subsequently, the photoresist composition was uniformly applied by spin coating, heated at 90° C. for 90 seconds and dried to obtain a resist film with a film thickness of 150 nm.

The resist film was irradiated with the $F_2$ excimer laser through the mask. After the exposure, the resist film was heated at 110° for 90 seconds, and subsequently was developed in the solution of 2.38% by weight of tetramethylammonium hydroxide. The development temperature was 23° C., and the development time period was 60 seconds. After the development, the resist film was washed with deionized water, and dried.

As a result, although a pattern of line and space (1:1) of 90 nm or less was formed, noticeable film reduction in the pattern was observed and the pattern shape became round and was not rectangular. The exposed dose at that time was 28 mJ/cm$^2$. Finer pattern than that could not be formed.

Comparative Example 9

A resist composition was prepared by the same way as in Comparative Example 7, except that salicylic acid was not used, and the evaluation was conducted.

As a result, although a pattern of line and space (1:1) of 90 nm or less was formed, film reduction in the pattern was observed and the pattern shape became round and was not rectangular.

Comparative Example 10

A resist composition was prepared by the same way as in Comparative Example 8, except that salicylic acid was not used, and the evaluation was conducted.

As a result, although a pattern of line and space (1:1) of 90 nm or less was formed, noticeable film reduction in the pattern was observed and the pattern shape became round and was not rectangular.

In the above Examples 12 to 15, the line and space (1:1) of 65 nm and the line and space (1:1.5) of 50 nm which had been conventionally difficult to form could be formed by the use of the fluorine-containing monocyclic polymer which was promising as the base polymer for the next generation resist for the base polymer as well as by the addition of the dissolution inhibitor having fluorine atoms to the resist composition. Moreover, the cross-sectional shape of the lines in these pattern retained the clear rectangular shape.

On the contrary, the patterns were formed in Comparative Examples 7 and 9 by the use of the publicly known dissolution inhibitor and in Comparative Examples 8 and 10 without using the dissolution inhibitor, but noticeable film reduction was observed in the line and space (1:1) of 90 nm or less. The pattern shapes became round and was not rectangular, which were off from practical use. From these Comparative Examples 7 to 10, it has been shown that the dissolution inhibitor having fluorine atoms is essential for the resist composition using the fluorine-containing monocyclic polymer for the base polymer.

From these results, it is understood that it is important to contain the fluorine-containing polymer as the major component, the acid generator which generates the acid by light irradiation, and the dissolution inhibitor having fluorine atoms in order to obtain the photoresist composition capable of obtaining the pattern resolution of the line and space size of 150 nm or less, preferably 100 nm or less and more preferably 90 nm or less by the lithography using irradiation light with a wavelength 200 nm or less, particularly the light of $F_2$ excimer laser, using the publicly known fluorine-containing polymer.

As described above, by the use of the photoresist composition of the present invention, various ultrafine pattern shapes such as patterns of line and space (1:1) of 90 nm or less and hole pattern (a ratio of hole to space is 1:1) with a diameter of about 100 nm, the resolution on the inorganic substrate and the substrate provided with the organic anti-reflection film, and the improvement of the resist pattern shape are accomplished. The resist pattern which is excellent in resist pattern defect, scum and rectangular property with good adhesiveness to the substrate may also be formed. In the present invention, the resist pattern resolution in a fine order such as line and space of 60 nm or less is possible at a practical level for the first time by combining the specific dissolution inhibitor with the base polymer having high transparency at such a wavelength of 157 nm, and furthermore, the invention can be excellent in coating uniformity for the substrate with large diameter and uniformity of the resist pattern.

REFERENCES

Non-patent Document 1: M. K. Crawford, et al., "New Material for 157 nm Photoresists: Characterization and Properties" Proceedings of SPIE, Vol. 3999, (2000) pp 357-364.

Non-patent Document 2: Shun-ichi Kodama et al., "Synthesis of Novel Fluoropolymer for 157 nm Photoresists by Cyclo-polymerization" Proceedings of SPIE, Vol. 4690, (2002) pp 76-83.

Patent Document 1: International Publication WO 00/67072 Pamphlet.

Patent Document 2: JP 2002-90997 A.

Patent Document 3: JP 2003-2925 A.

The invention claimed is

1. A photoresist composition comprising:
   a polymer (A) comprising an alkali-soluble constituent unit (a1) comprising an alicyclic group having both a fluorine atom(s) or a fluorinated alkyl group (i) and an alcoholic hydroxyl group (ii), wherein alkali-solubility of said polymer is changeable by an action of an acid, wherein said fluorine atom or fluorinated alkyl group (i) and said alcoholic hydroxyl group (ii) are each bound onto the alicyclic group, and the cyclic group constitutes a main chain and wherein said constituent unit (a1) is formed by cyclic polymerization of a diene compound having a hydroxyl group and fluorine atoms;
   an acid generator (B) which generates an acid by light irradiation; and
   a dissolution inhibitor (C) having a fluorine atom(s), wherein said dissolution inhibitor having a fluorine atom(s) is a compound represented by the following general formula (1) or (2):

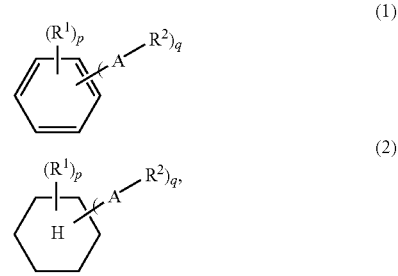

wherein $R^1$ is a hydrogen atom, alkyl, alkoxy or a fluorine atom, $R^2$ is an acid-dissociative dissolution inhibiting group, A is a bivalent organic group represented by $-C(C_nF_{2n+1})(C_mF_{2m+1})-O-CO-O-$, $C(C_nF_{2n+1})(C_mF_{2m+1})-O-$ or $-O-CO-O-$, and n, m, p and q are each independently integers of 1 to 4; with a proviso that, when A is $-O-CO-O-$, $R^1$ is at least one fluorine atom.

2. The photoresist composition according to claim 1, wherein said diene compound is heptadiene.

3. The photoresist composition according to claim 2, wherein said heptadiene is 1,1,2,3,3-pentafluoro-4-trifluoromethyl-4-hydroxy-1,6-heptadiene $[CF_2=CFCF_2C(CF_3)(OH)CH_2CH=CH_2]$.

4. The photoresist composition according to claim 1, wherein said polymer (A) further comprises a constituent unit (a4) wherein a hydrogen atom of the alcoholic hydroxyl group in said constituent unit (a1) is substituted with an acid-dissociative dissolution inhibiting group.

5. The photoresist composition according to claim 4, wherein said acid-dissociative dissolution inhibiting group is a straight, branched or cyclic alkyloxymethyl group having 1 to 15 carbon atoms.

6. The photoresist composition according to claim 1, wherein said $R^2$ is a straight, branched or cyclic alkyloxymethyl group having 1 to 15 carbon atoms or a tertiary alkyl group.

7. The photoresist composition according to claim 1, wherein said compound represented by the general formula (1) or (2) is at least one selected from compounds represented by the following chemical formulae (3) to (8):

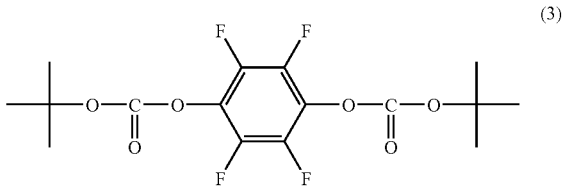

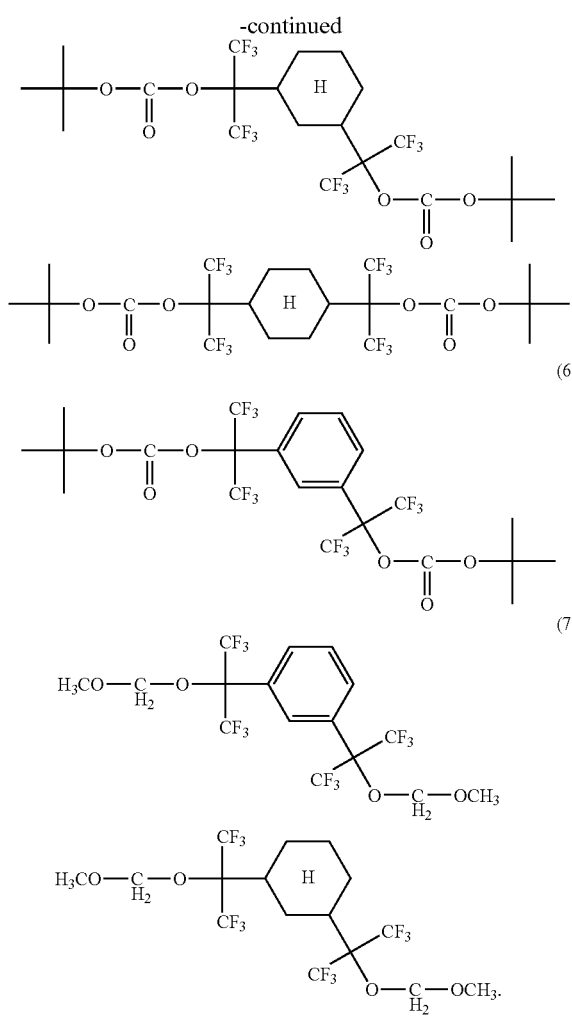

8. The photoresist composition according to claim 1, wherein the content of said dissolution inhibitor is 2 to 30 parts by weight based on 100 parts by weight of the major component polymer.

9. The photoresist composition according to claim 1, further comprising an amine as an additive component.

10. A method for forming a resist patterns, comprising:
applying the photoresist composition of claim 1 on a substrate to form a resist film, giving a selective exposure, a post-exposure heating; and a development.

11. The method for forming the resist pattern according to claim 10, wherein a light source is a $F_2$ excimer laser.

12. A photoresist composition comprising:
a polymer (A) comprising an alkali-soluble constituent unit (a1) comprising an alicyclic group having both a fluorine atom or a fluorinated alkyl group (i) and an alcoholic hydroxyl group (ii), wherein alkali-solubility of said polymer is changeable by an action of an acid, wherein said fluorine atom or fluorinated alkyl group (i) and said alcoholic hydroxyl group (ii) are each bound onto the alicyclic group, and the cyclic group constitutes a main chain and wherein said constituent unit (a1) is formed by cyclic polymerization of a diene compound having a hydroxyl group and fluorine atoms;
an acid generator (B) which generates an acid by light irradiation; and
a nitrogen-containing compound (D) which is a tertiary alkylamine (d2), wherein 3 alkyl groups having 6 or more and 15 or less of carbon atoms are bound to a nitrogen atom.

13. The photoresist composition according to claim 12, wherein said diene compound is heptadiene.

14. The photoresist composition according to claim 13, wherein said heptadiene is 1,1,2,3,3-pentafluoro-4-trifluoromethyl-4-hydroxy-1,6-heptadiene [$CF_2$=$CFCF_2C(CF_3)$(OH)$CH_2CH$=$CH_2$].

15. The photoresist composition according to claim 12, wherein said polymer (A) further comprises a constituent unit (a4) wherein a hydrogen atom of the alcoholic hydroxyl group in said constituent unit (a1) is substituted with an acid-dissociative dissolution inhibiting group.

16. The photoresist composition according to claim 15, wherein said acid-dissociative dissolution inhibiting group is a straight, branched or cyclic alkyloxymethyl group having 1 to 15 carbon atoms.

17. The photoresist composition according to claim 12, further containing a dissolution inhibitor (C) having a fluorine atom(s), wherein said dissolution inhibitor (C) having a fluorine atom(s) is a compound represented by the following general formula (1) or (2):

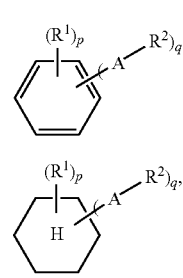

wherein $R^1$ is a hydrogen atom, alkyl, alkoxy or a fluorine atom, $R^2$ is an acid-dissociative dissolution inhibiting group, A is a bivalent organic group represented by -C($C_nF_{2n+1}$)($C_mF_{2m+1}$)—O—CO—O—, C($C_nF_{2n+1}$)($C_mF_{2m+1}$)—O— or —O—CO—O—, and n, m, p and q are each independently integers of 1 to 4 with a proviso that, when A is —O—CO—O—, $R^1$ is at least one fluorine atom.

18. The photoresist composition according to claim 17, wherein said $R^2$ is a straight, branched or cyclic alkyloxymethyl group having 1 to 15 carbon atoms or a tertiary alkyl group.

19. The photoresist composition according to claim 17, wherein the compound represented by the general formula (1) or (2) is at least one selected from compounds represented by the following chemical formulae (3) to (8):

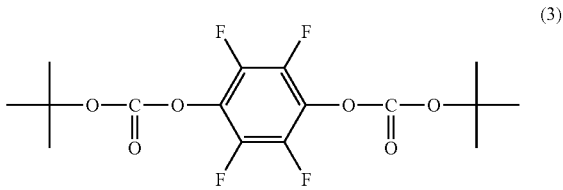

-continued
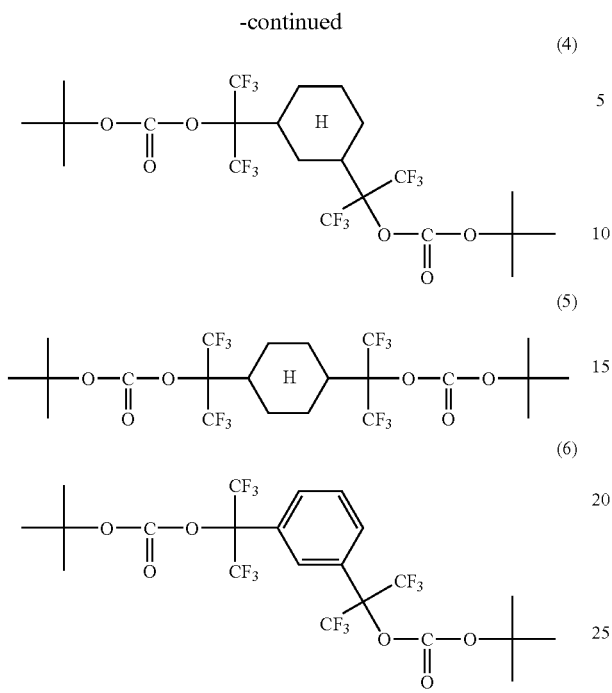
(4)
(5)
(6)
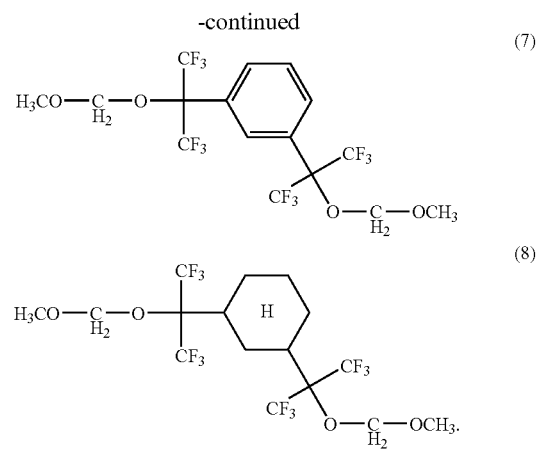
(7)
(8)
20. A method for forming a resist pattern, comprising: applying the photoresist composition of claim 12, on a substrate to form a resist film, giving a selective exposure, a post-exposure heating; and a development.
21. The method for forming the resist pattern according to claim 20, wherein a light source is a $F_2$ excimer laser.
* * * * *